(12) United States Patent
Wessel

(10) Patent No.: US 10,580,446 B1
(45) Date of Patent: Mar. 3, 2020

(54) HEAT-ASSISTED MAGNETIC RECORDING DEVICE INCORPORATING LASER DIODE TEMPERATURE CONTROL USING COMMON-MODE VOLTAGE

(71) Applicant: Seagate Technology LLC, Cupertino, CA (US)

(72) Inventor: James Gary Wessel, Savage, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 16/136,512

(22) Filed: Sep. 20, 2018

(51) Int. Cl.
*G11B 5/60* (2006.01)
*G11B 11/105* (2006.01)
*G11B 5/00* (2006.01)

(52) U.S. Cl.
CPC ...... *G11B 5/6088* (2013.01); *G11B 11/10536* (2013.01); *G11B 2005/0021* (2013.01)

(58) Field of Classification Search
None
See application file for complete search history.

(56) References Cited

U.S. PATENT DOCUMENTS

| | | |
|---|---|---|
| 8,488,435 B2 | 7/2013 | Snyder |
| 8,532,156 B2 | 9/2013 | Olson |
| 8,854,928 B1 | 10/2014 | Kuehlwein |
| 9,281,659 B1 | 3/2016 | Tatah et al. |
| 9,418,691 B2 | 8/2016 | Peng et al. |
| 9,595,288 B1 | 3/2017 | Chu et al. |
| 9,620,163 B1 | 4/2017 | Zheng et al. |
| 9,711,173 B2 | 7/2017 | Olson et al. |
| 9,792,949 B1 | 10/2017 | Ma et al. |
| 9,805,749 B1 | 10/2017 | Lee et al. |
| 9,812,159 B1 | 11/2017 | Macken |
| 9,818,447 B1 | 11/2017 | Zheng |
| 9,905,996 B2 | 2/2018 | Wessel et al. |
| 9,916,849 B1 | 3/2018 | Mader et al. |
| 9,940,959 B1 | 4/2018 | Granz et al. |
| 9,940,965 B2 | 4/2018 | Tatah et al. |
| 9,959,893 B1 | 5/2018 | Duda et al. |
| 9,984,719 B2 | 5/2018 | Matousek et al. |

*Primary Examiner* — Craig A. Renner
(74) *Attorney, Agent, or Firm* — Mueting, Raasch & Gebhardt, P.A.

(57) ABSTRACT

An apparatus comprises a slider configured to facilitate heat assisted magnetic recording. The slider comprises a plurality of bond pads including a first electrical bond pad, a second electrical bond pad, and a ground pad. A laser diode comprises an anode coupled to the first electrical bond pad and a cathode coupled to the second electrical bond pad. The laser diode is operable in a non-lasing state and a lasing state. A heater is coupled between the ground pad and at least one of the anode and cathode of the laser diode. The heater is configured to generate heat for heating the laser diode during the non-lasing state and the lasing state.

16 Claims, 10 Drawing Sheets

HEAT-ASSISTED MAGNETIC RECORDING DEVICE INCORPORATING LASER DIODE TEMPERATURE CONTROL USING COMMON-MODE VOLTAGE

SUMMARY

Embodiments are directed to an apparatus comprising a slider configured to facilitate heat assisted magnetic recording. The slider comprises a plurality of bond pads including a first electrical bond pad, a second electrical bond pad, and a ground pad. A laser diode comprises an anode coupled to the first electrical bond pad and a cathode coupled to the second electrical bond pad. The laser diode is operable in a non-lasing state and a lasing state. A heater is coupled between the ground pad and at least one of the anode and cathode of the laser diode. The heater is configured to generate heat for heating the laser diode during the non-lasing state and the lasing state.

Embodiments are directed to an apparatus comprising a slider configured to facilitate heat assisted magnetic recording. The slider comprises a plurality of bond pads including a first electrical bond pad, a second electrical bond pad, and a ground pad. A laser diode comprises an anode coupled to the first electrical bond pad and a cathode coupled to the second electrical bond pad. The laser diode is operable in a lasing state in response to a first differential voltage supplied to the anode and the cathode, and the laser diode is operable in a non-lasing state in response to a second differential voltage supplied to the anode and the cathode. A heater is coupled between the ground pad and at least one of the anode and cathode of the laser diode. The heater is configured to generate heat for heating the laser diode during the non-lasing state and the lasing state in response to a common-mode voltage developed between the ground pad and the at least one of the anode and cathode of the laser diode.

Embodiments are directed to a method comprising supplying a differential voltage across a laser diode disposed on or coupled to a slider configured to facilitate heat assisted magnetic recording. The method also comprises energizing a heater situated proximate the laser diode using a common-mode voltage developed between the laser diode and ground. The method further comprises heating the laser diode during a non-lasing state and a lasing state using the heater to avoid a temperature associated with power instability of the laser diode during the lasing state.

The above summary is not intended to describe each disclosed embodiment or every implementation of the present disclosure. The figures and the detailed description below more particularly exemplify illustrative embodiments.

BRIEF DESCRIPTION OF THE DRAWINGS

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

The present disclosure generally relates to heat-assisted magnetic recording (HAMR), also referred to as energy-assisted magnetic recording (EAMR), thermally-assisted magnetic recording (TAMR), and thermally-assisted recording (TAR). This technology uses a laser source and a near-field transducer (NFT) to heat a small spot on a magnetic disk during recording. The heat lowers magnetic coercivity at the spot, allowing a write transducer to change the orientation of a magnetic domain at the spot. Due to the relatively high coercivity of the medium after cooling, the data is less susceptible to superparamagnetic effects that can lead to data errors.

Figure 1:
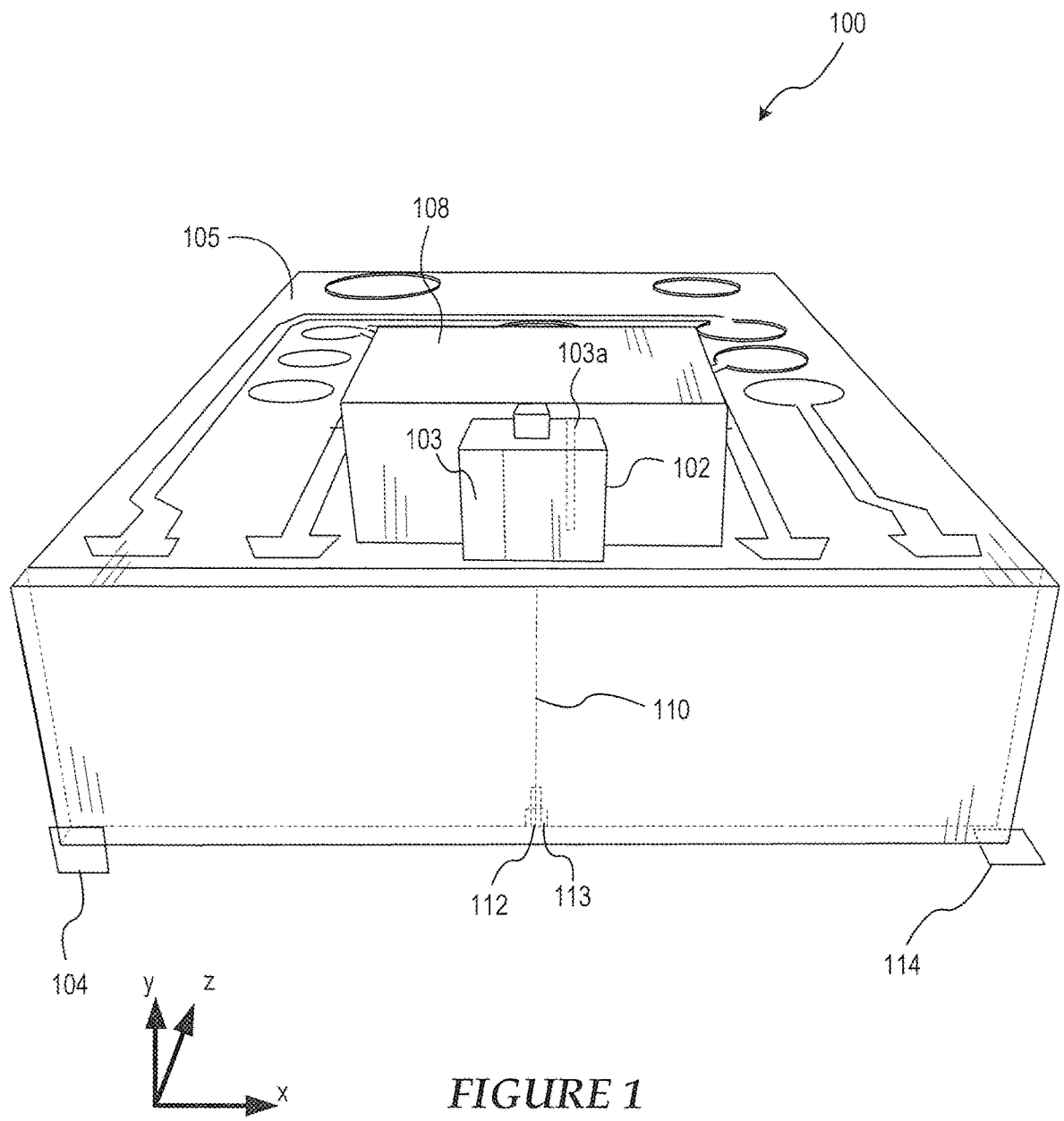
FIG. 1 is a perspective view of a HAMR slider with which various embodiments disclosed herein may be implemented.
Figure 2:
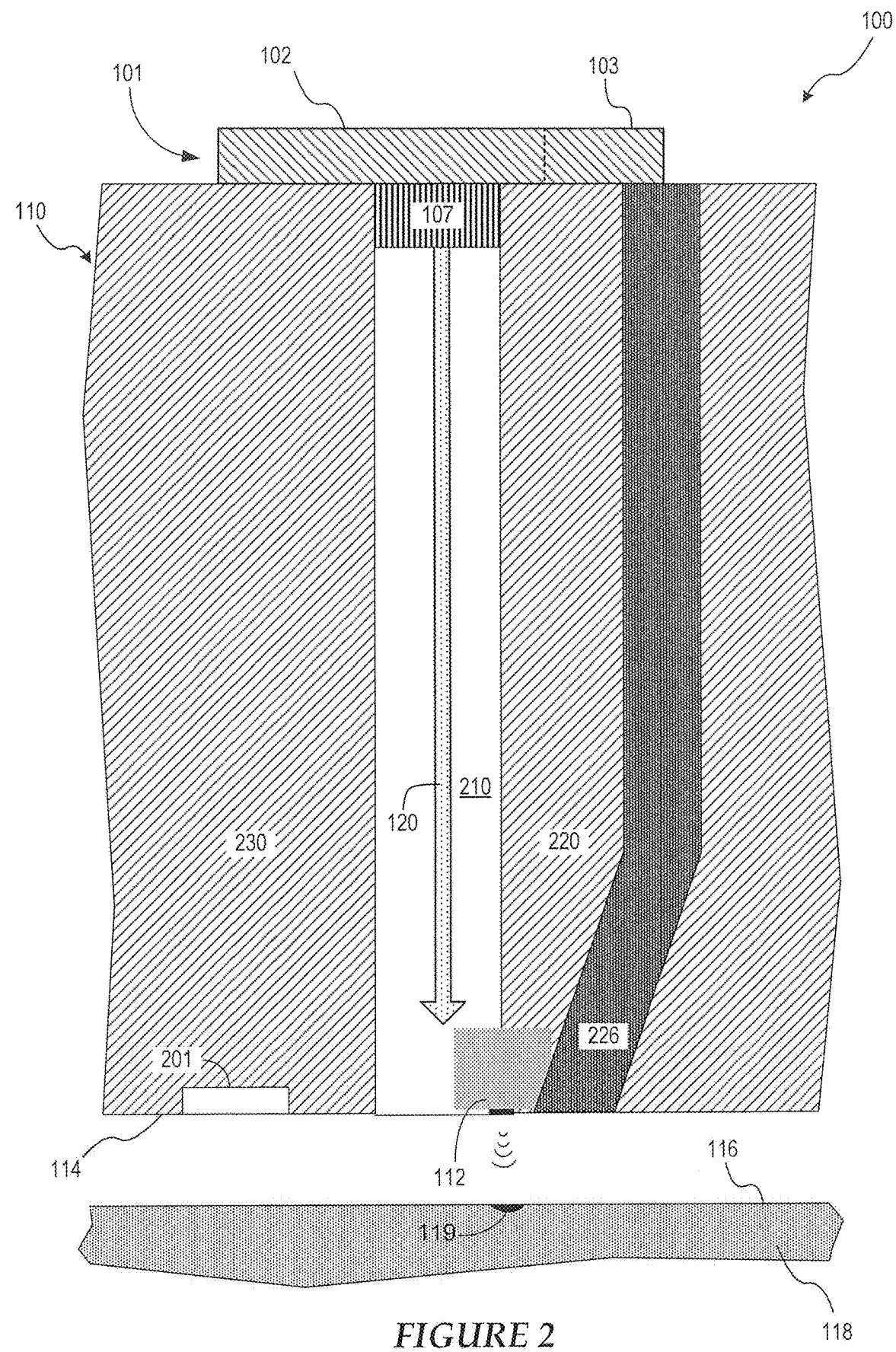
FIG. 2 is a cross-sectional view of a HAMR slider with which various embodiments disclosed herein may be implemented.

Embodiments of a HAMR slider 100 are illustrated in FIGS. 1 and 2. As shown, the head 100 (also referred to as a slider) includes a light source (e.g., a laser diode) 102 located proximate a trailing edge surface 104 of the slider body 105. An optical wave (e.g., a laser beam) generated by the light source 102 is delivered to an NFT 112 via an optical waveguide 110. The NFT 112 is aligned with a plane of an air bearing surface (ABS) 114 of the head 100, and one edge of a read/write head 113 is on the ABS 114. While the representative embodiments of FIGS. 1 and 2 show the waveguide 110 integrated with the head 100, any type of light delivery configuration may be used.

The read/write head 113 includes at least one writer and at least one reader. In some embodiments, multiple writers (e.g., 2 writers) and multiple readers (e.g., 3 readers) can be incorporated into the read/write head 113. The ABS 114 faces, and is held proximate to, a surface 116 of a magnetic medium 118 during device operation. The ABS 114 is also referred to as a media-facing surface. The laser diode 102 in this representative example may be an integral, edge emitting device, although it will be appreciated that any source of electromagnetic energy may be used. For example, a surface emitting laser (SEL), instead of an edge emitting laser, may be used as the laser source 102. A laser source 102 may also be mounted alternatively to other surfaces of the head 100, such as the trailing edge surface 104.

According to various embodiments, a heater 103 is thermally coupled to the laser diode 102. For example, the heater 103 can be situated in close proximity to, or incorporated as a component of, the laser diode 102. In some embodiments, the laser diode 102 and the heater 103 can be incorporated in a package referred to as a laser diode unit 101. In various embodiments, the heater 103 includes one or a multiplicity of heating elements (referred to herein generally as heaters). In FIG. 1, the laser diode 102 and heater 103 are shown coupled to the slider body 105 via a submount 108. The submount 108 can be used to orient and affix an edge-emitting laser diode 102 so that its output is directed downwards (negative y-direction in the figure). An input surface of the slider body 105 may include a grating, an optical coupler, or other coupling features to receive light from the laser diode 102. In some embodiments, the heater 103 is incorporated in or on the submount 108 that couples the laser diode 102 to the slider body 105. For example, one or more of the heaters 103 can be affixed to, or incorporated along, a surface of the submount 108 that contacts a surface of the laser diode 102. As is shown in FIG. 1, a heater 103a can be a heater of the submount 108 which is situated in abutment with the laser diode 102. The heater 103a can also be located on or in the laser diode 102.

The heater 103 is configured to heat the laser diode 102 to improve the stability of output optical power of the laser diode 102. According to various embodiments, the heater 103 is configured to change the temperature of a junction of the laser diode 102 from a temperature associated with laser output power instability to a temperature associated with laser output power stability. For example, the heater 103 can be configured to pre-heat the laser diode 102 during times when the laser diode 102 is not lasing (e.g., prior to and/or after a write operation) and/or is lasing but not at an optical output sufficient for a write operation. The heater 103 can also be configured to heat the laser diode 102 when the laser diode 102 is lasing during a write operation. During the write operation, the heater 103 can steer the temperature of the laser diode away from a temperature associated with laser output power instability and towards a temperature associated with laser output power stability.

When writing with a HAMR device, electromagnetic energy is concentrated onto a small hotspot 119 over the track of the magnetic medium 118 where writing takes place, as is shown in the embodiment of FIG. 2. The light from the laser diode 102 propagates to the NFT 112, e.g., either directly from the laser diode 102 or through a mode converter or by way of a focusing element. FIG. 2, for example, shows an optical coupler 107 adjacent the laser diode 102, which is configured to couple light produced from the laser diode to the waveguide 110.

As a result of what is known as the diffraction limit, optical components cannot be used to focus light to a dimension that is less than about half the wavelength of the light. The lasers used in some HAMR designs produce light with wavelengths on the order of 700-1550 nm, yet the desired hot spot 119 is on the order of 50 nm or less. Thus, the desired hot spot size is well below half the wavelength of the light. Optical focusers cannot be used to obtain the desired hot spot size, being diffraction limited at this scale. As a result, the NFT 112 is employed to create a hotspot on the media.

The NFT 112 is a near-field optics device configured to generate local surface plasmon resonance at a designated (e.g., design) wavelength. The NFT 112 is generally formed from a thin film of plasmonic material on a substrate. In a HAMR slider 100, the NFT 112 is positioned proximate the write pole 226 of the read/write head 113. The NFT 112 is aligned with the plane of the ABS 114 parallel to the surface 116 of the magnetic medium 118. The waveguide 110 and optional mode converter 107 and/or other optical element directs electromagnetic energy 120 (e.g., laser light) onto the NFT 112. The NFT 112 achieves surface plasmon resonance in response to the incident electromagnetic energy 120. The plasmons generated by this resonance are emitted from the NFT 112 towards the magnetic medium 118 where they are absorbed to create a hotspot 119. At resonance, a high electric field surrounds the NFT 112 due to the collective oscillations of electrons at the metal surface (e.g., substrate) of the magnetic medium 118. At least a portion of the electric field surrounding the NFT 112 gets absorbed by the magnetic medium 118, thereby raising the temperature of a spot 119 on the medium 118 to the Curie temperature as data is being recorded.

FIG. 2 shows a detailed partial cross-sectional view of an embodiment of the HAMR slider 100 in accordance with various embodiments. The waveguide 110 includes a layer of core material 210 surrounded by first and second cladding layers 220 and 230. The first cladding layer 220 is shown proximate the NFT 112 and the write pole 226. The second cladding layer 230 is spaced away from the first cladding layer 220 and separated therefrom by the waveguide core 210. The core layer 210 and cladding layers 220 and 230 may be fabricated from dielectric materials, such as optical grade amorphous material with low thermal conductivities. The first and second cladding layers 220 and 230 may each be made of the same or a different material. The materials are selected so that the refractive index of the core layer 210 is higher than refractive indices of the cladding layers 220 and 230. This arrangement of materials facilitates efficient propagation of light through the waveguide core 210. Optical focusing elements (not shown) such as mirrors, lenses, etc., may be utilized to concentrate light onto the NFT 112. These and other components may be built on a common substrate using wafer manufacturing techniques known in the art. The waveguide 110 may be configured as a planar waveguide or channel waveguide.

According to some embodiments, the head 100 includes one or more sensors, such as the sensor 201 shown in FIG. 2. In some embodiments, the sensor 201 can be a contact sensor configured to sense for one or more of head-medium contact, thermal asperities, and voids of a magnetic recording medium. In other embodiments, the sensor 201 can be a bolometer or a combined contact sensor/bolometer. The sensor 201 can be configured to produce a response to laser light that is used to detect laser diode instability, such as mode hops, in accordance with various embodiments. The sensor 201 can be a resistive sensor that can be implemented as a thermal sensor, such as a resistive temperature sensor (e.g., TCR sensor). The sensor 201 can be a thermoresistive/electric sensor or a piezoresistive/electrical sensor, for example. By way of further example, the sensor 201 can be a thermocouple or a thermistor. The sensor 201 can be situated at or near the ABS 114 and proximate the NFT 112. As such, the sensor 201 can also serve as a temperature sensor for the NFT 112 and as a head-medium/asperity contact sensor.

The output of a laser diode used in a HAMR drive is temperature sensitive and susceptible to self-heating. During a write operation, for example, laser diode heating can vary the junction temperature of the laser diode, causing a shift in laser emission wavelength, leading to a change of optical feedback from the optical path in the slider to the cavity of the laser diode, a phenomenon that is known to lead to mode hopping and/or power instability of the laser diode. Mode hopping is particularly problematic in the context of lasers emitting primarily a single frequency. Under some external influences, such a laser may operate on one resonator mode (e.g., produce energy with a first wavelength) for some time, but then suddenly switch to another mode (produce energy, often with different magnitude, with a second wavelength) performing "mode hopping." Temperature variation is known to cause mode hopping in laser diodes. Mode hopping is problematic for HAMR applications, as mode hopping leads to laser output power jumping and magnetic transition shifting from one data bit location (e.g., one block of data) to another. It is noted that the laser output power can jump in either direction (higher or lower) with a mode hop and that a jump in either direction is undesirable. Large transition shifts in a data bit location due to a mode hop may not be recoverable by channel decoding, resulting in error bits. Also, writing width varies with laser power so power fluctuations can lead to erasure of adjacent tracks or undesirably narrow written tracks. Heating the laser diode 102 by the heater 103, such as prior to and/or during a write operation, reduces temperature fluctuations at the laser diode junction, which serves to reduce the likelihood of mode hopping.

Figure 3:
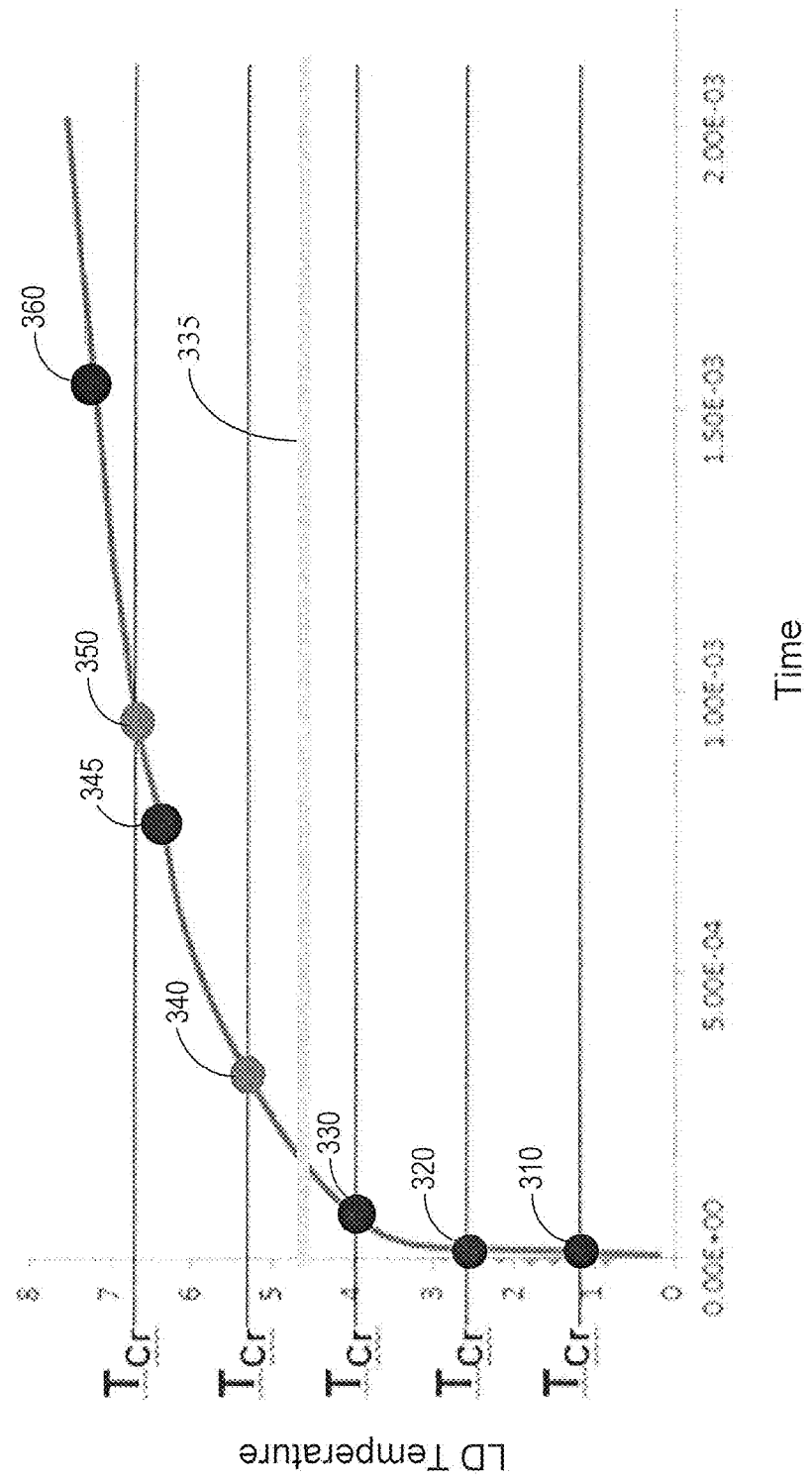
FIG. 3 shows a temperature versus time graph for a laser diode.

According to various implementations, and with reference to FIGS. 2 and 3, when the laser diode 102 heats up in response to a write request, instabilities in the system may arise. These instabilities may occur at specific critical temperatures ($T_{Cr}$). These critical temperatures may be different for every laser diode and/or may depend of various factors such as the current environment, for example. FIG. 3 shows the temperature versus time for a representative laser diode. In this example, there are five critical temperatures 310, 320, 330, 340, 350. When heating up a laser diode, the temperature rises quickly at first and then starts to level off. The critical temperatures are substantially periodic. Thus, more critical temperatures are experienced in a short period of time at the beginning of the heat-up process because the system is heating up more quickly than at later times. Therefore, it can be observed that the higher the slope of the temperature rise in time, the higher the probability of reaching a higher number of critical temperatures.

If the system can start pre-heating the laser diode to a temperature before the write process starts, the number of possible transitions though critical temperatures is reduced. If a pre-heat takes place and the system is heated to temperature 335 shown in FIG. 3, for example, the first three critical temperatures 310, 320, 330 are reached before the write operation starts and only two critical temperatures 340, 350 are experienced during the write operation. A system without a laser diode heating pre-heat feature would experience all five 310, 320, 330, 340, 350 critical temperatures in this example. Moreover, if the system can heat the laser diode during the write process, the laser diode temperature can be steered away from a critical temperature and into a region of laser output power stability between critical temperatures. For example, assume that a laser diode is at temperature 345 shown in FIG. 3 during a write operation and approaching critical temperature 350 during the write operation. Because the laser diode temperature 345 is approaching the critical temperature 350, the system may apply steering heat during the write operation in order to elevate the temperature of the laser diode away from the critical temperature 350 and to a higher temperature 360 associated with laser output power stability. The system preferably repeats the pre-heating and steering heat generation processes for subsequent write operations.

Embodiments of the disclosure are directed to a laser diode heating apparatus and method that can provide preheat (prior to a write operation) and steering heat (during a write operation) to the laser diode in a manner that improves the stability of output optical power of the laser diode 102. Embodiments of the disclosure are directed to heating circuitry configured to provide pre-heat and steering heat to a laser diode of a HAMR slider using only the electrical bond pads of the slider needed to operate the laser diode (no additional electrical bond pads are needed for the heating circuitry).

Figure 4:
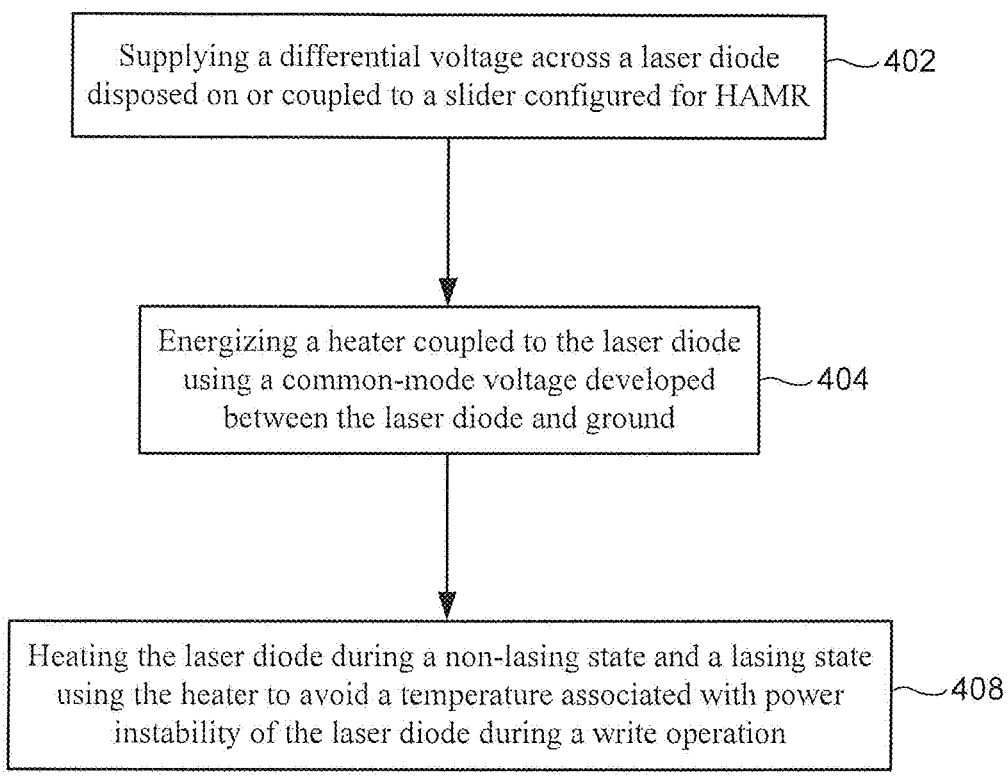
FIG. 4 illustrates a method of heating a laser diode of a HAMR slider in accordance with various embodiments.

FIG. 4 illustrates a method of heating a laser diode of a HAMR slider in accordance with various embodiments. The method shown in FIG. 4 involves supplying 402 a differential voltage across a laser diode disposed on or coupled to a HAMR slider. The method involves energizing 404 a heater coupled to the laser diode using a common-mode voltage developed between the laser diode and ground. It is noted that a magnitude of the common-mode voltage is independent of a magnitude of the differential voltage. The method also involves heating 408 the laser diode during a non-lasing state and a lasing state using the heater to avoid a temperature associated with power instability of the laser diode during a write operation.

Figure 5:
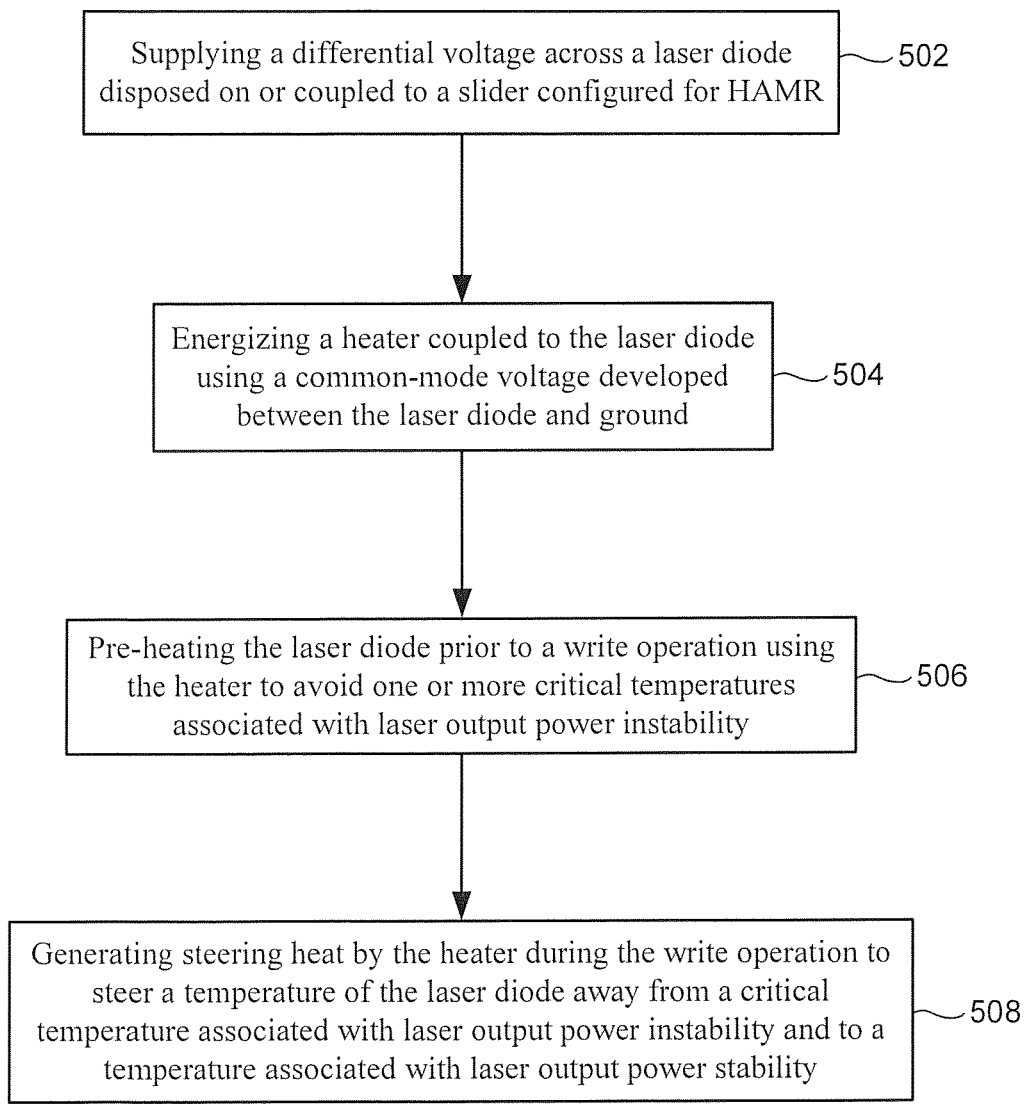
FIG. 5 illustrates a method of heating a laser diode of a HAMR slider in accordance with various embodiments.

FIG. 5 illustrates a method of heating a laser diode of a HAMR slider in accordance with various embodiments. The method shown in FIG. 5 involves supplying 502 a differential voltage across a laser diode disposed on or coupled to a HAMR slider. The method involves energizing 504 a heater coupled to the laser diode using a common-mode voltage developed between the laser diode and ground. It is noted that a magnitude of the common-mode voltage is independent of a magnitude of the differential voltage. The method also involves pre-heating 506 the laser diode prior to a write operation using the heater to avoid one or more critical temperatures associated with laser output power instability. The method further involves generating steering heat 508 by the heater during the write operation to steer a temperature of the laser diode away from a critical temperature associated with laser output power instability and towards a temperature associated with laser output power stability.

Figure 6:
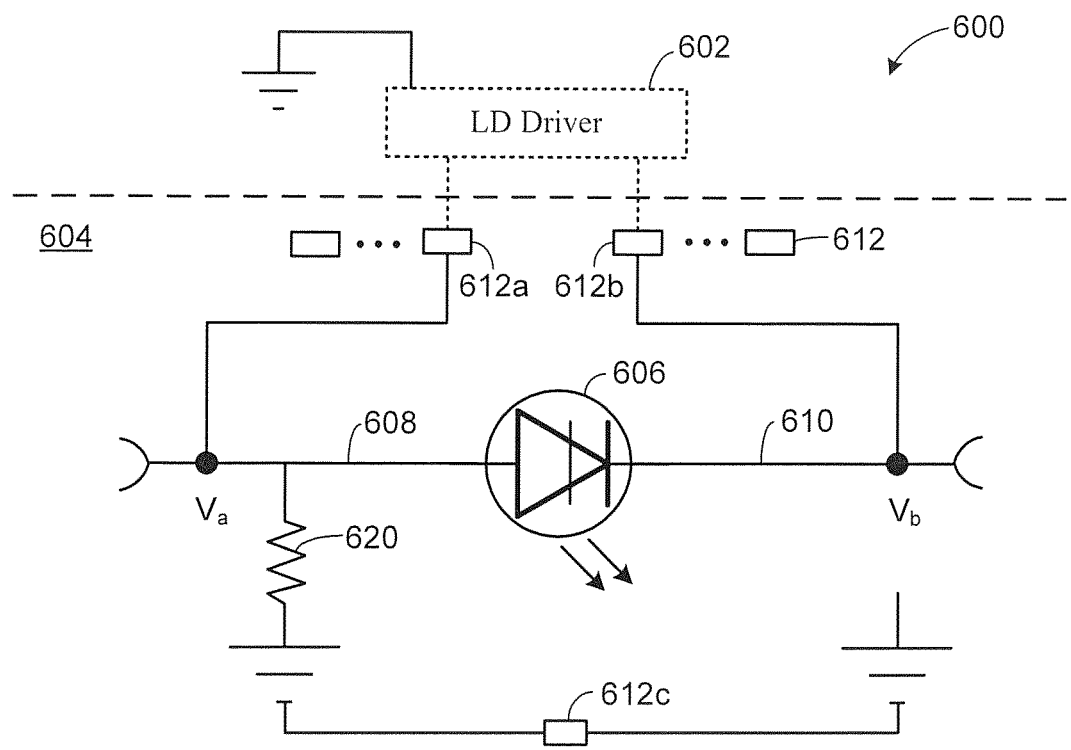
FIG. 6 illustrates circuitry of a HAMR slider including a heater proximate a laser diode in accordance with various embodiments.

FIG. 6 illustrates circuitry of a HAMR slider including a heater situated proximate a laser diode in accordance with various embodiments. The circuitry 600 shown in FIG. 6 includes a slider 604 configured for HAMR. The slider 604 includes a multiplicity of bond pads 612 including a first electrical bond pad 612a, a second electrical bond pad 612b, and a ground pad 612c. A laser diode 606 includes an anode 608 and a cathode 610. The laser diode 606 is coupled to a laser diode driver 602 via the first and second electrical bond pads 612a, 612b. In the embodiment shown in FIG. 6 (and in other embodiments, see, e.g., FIGS. 7-8 and 10-12), the laser diode 606 and the laser diode driver 602 share a common ground.

In some embodiments, the laser diode 606 can be incorporated in a package referred to as a laser diode unit (LDU), which is mounted to an external surface of the slider 604 (e.g., via a submount) and optically coupled to integrated optics of the slider 606. The LDU can include a substrate, the laser diode 606 on the substrate, and an enclosure around the laser diode 606 and substrate. The LDU can also incorporate a heater 620 configured to heat the laser diode 606. The laser diode 606 can be, for example, a gallium arsenide or indium phosphide semiconductor diode laser. The laser diode 606 can be constructed of, for example, AlGaAs, GaAs, AlGaInP, GaN, AlGaN or InGaN. Other material systems could be used as well for the diode laser 606, and such material systems will dictate the wavelength of emitted light. Examples of an LDU mounted to an external service of the slider 604 are disclosed in commonly owned U.S. Pat. No. 9,805,749, which is incorporated herein by reference. In other embodiments, the laser diode 606 may be integral (built-in) to the slider structure. For example, the laser diode 606 can be implemented as a laser-in-slider device, examples of which are disclosed in commonly owned U.S. Pat. No. 8,532,156, which is incorporated herein by reference. Other configurations of the laser diode 606 are contemplated.

The anode 608 of the laser diode 606 is coupled to the first electrical bond pad 612a. The cathode 610 of the laser diode 606 is coupled to the second electrical bond pad 612b. The first and second electrical bond pads 612a, 612b, supply a differential voltage, $V_a$-$V_b$, across the laser diode 606. The optical output of the laser diode 606 is controlled by the differential voltage, $V_a$-$V_b$, and the current fed to the laser diode 606. For example, when the differential voltage, $V_a$-$V_b$, exceeds a threshold voltage of the laser diode 606, the laser diode 606 is forward biased which causes the laser diode 606 to produce light. When the laser diode 606 produces light, the laser diode 606 is said to be operating in a lasing state. During a write operation, for example, the laser diode 606 is in a lasing state and the differential voltage, $V_a$-$V_b$, is set at a specified voltage that causes the laser diode 606 to produce sufficient laser optical output to heat a spot on a magnetic recording medium (via an NFT) to the Curie temperature. When the differential voltage, $V_a$-$V_b$, fails to exceed the threshold voltage, no or very little light is emitted and the laser diode 606 is said to be in a non-lasing state.

At a fixed differential voltage, $V_a$-$V_b$, the voltage $V_a$ or, alternatively, $V_b$, relative to ground 612c is irrelevant to laser optical output of the laser diode 606. The difference between the voltage $V_a$ or the voltage $V_b$ and ground 612c is referred to herein as a common-mode voltage. The magnitude of this common-mode voltage is independent of the differential voltage, $V_a$-$V_b$. As such, the magnitude of the common-mode voltage does not impact laser optical output of the laser diode 606. According to various embodiments, this common-mode voltage is used to drive heater circuitry of the slider 604 to heat the laser diode 606 in the various manners described herein (e.g., via pre-heating and steering heat). Heating the laser diode 606 using common-mode voltage supplied to the heater 620 advantageously obviates the need to connect laser diode heating circuitry to additional electrical bond pads of the slider 604. Instead, the common-mode voltage(s) supplied to the heater 620 is/are developed from the same electrical bond pads that drive the laser diode 606.

In the embodiment shown in FIG. 6, the heater 620 is coupled between the anode 608 of the laser diode 606 and a ground pad 612c. The heater 620 is a resistive element, such as a resistor or a thermistor. In the case of a thermistor, the heater 620 can serve as a temperature sensor of the diode junction temperature (during non-lasing and lasing states) in addition to providing heating to the diode junction. The difference between the common-mode voltage Va and the potential at the ground pad 612c causes current to flow through the heater 620. Current flowing through the heater 620 warms the junction of the laser diode 606. Because the difference between the common-mode voltage $V_a$ at the anode 608 and the ground pad potential is independent of the differential voltage, $V_a$-$V_b$, the magnitude of voltage across and current flow through the heater 620 is independent of the voltage across and current flow through the laser diode 606. The spatial proximity of the heater 620 to the junction of the laser diode 606 is such that heat can quickly diffuse to the laser diode junction.

The heater 620 can be activated to pre-heat the laser diode 606 prior to a write operation in order to avoid one or more critical temperatures associated with laser output power instability. Pre-heating of the laser diode 606 can occur during the non-lasing state of the laser diode 606, but is discontinued at or prior to the initiation of the write operation. The intensity of the heat generated by the heater 620 during pre-heating can be controlled by adjusting the magnitude of the difference between the common-mode voltage $V_a$ and the ground pad 612c. The heater 620 can also be activated to generate steering heat for heating the laser diode 606 during the write operation in order to avoid one or more critical temperatures associated with laser output power instability. The intensity of the steering heat generated by the heater 620 can be controlled by adjusting the magnitude of the difference between the common-mode voltage $V_a$ and the ground pad 612c.

According to various embodiments, the laser diode driver 602 is coupled to the first and second electrical bond pads 612a, 612b. The laser diode driver 602 can be configured to set and adjust the magnitude and polarity of a voltage provided at each of the first and second electrical bond pads 612a, 612b. The laser diode driver 602 or another component coupled to the slider (e.g., a preamplifier) can be configured to set and adjust the magnitude and polarity of the potential at the ground pad 612c. It is noted that the laser diode driver 602 is configured to supply the laser diode 606 with specified currents (e.g., $I_{BIAS}$, $I_{OP}$) during various operations (e.g., seeks, write operations) in addition to the current supplied to the heater 620.

The magnitude and adjustment of the differential voltage, $V_a$-$V_b$, and the current fed to the laser diode 606 (via the first and second electrical bond pads 612a, 612b) is controlled by the laser diode driver 602. The laser diode driver 602 also controls the magnitude and adjustment of the common-mode voltage developed between the anode 608 and the ground pad 612c and/or between the cathode 610 and the ground pad 612c. For example, the laser diode driver 602 can increase or decrease the magnitude (and/or change the polarity) of the common-mode voltage $V_a$ to set and/or adjust the heat generated by the heater 620 (e.g., for generating pre-heat and steering heat), while keeping the differential voltage, $V_a$-$V_b$, at a constant magnitude. The laser diode driver 602 is typically a component of a preamplifier of a HAMR device which incorporates the slider 604.

Figure 7:
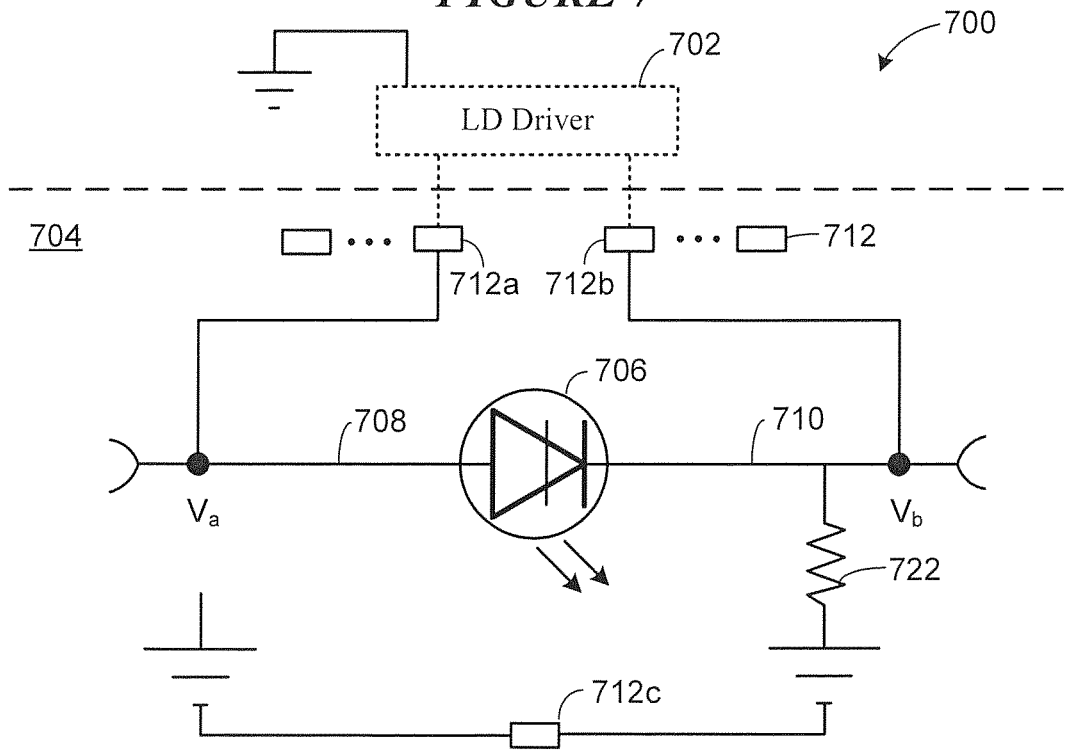
FIG. 7 illustrates circuitry of a HAMR slider including a heater proximate a laser diode in accordance with various embodiments.

FIG. 7 illustrates circuitry of a HAMR slider including a heater situated proximate a laser diode in accordance with various embodiments. The circuitry 700 shown in FIG. 7 includes a slider 704 configured for HAMR. The circuitry 700 is configured to operate in a manner similar to that shown in FIG. 6. The slider 704 includes a multiplicity of bond pads 712 including a first electrical bond pad 712a, a second electrical bond pad 712b, and a ground pad 712c. A laser diode 706 includes an anode 708 and a cathode 710. In some embodiments, the laser diode 706 can be incorporated in an LDU mounted to an external surface of the slider 704 (e.g., via a submount) and optically coupled to integrated optics of the slider 704. The LDU can incorporate a heater 722 configured to heat the laser diode 706. In other embodiments, the laser diode 706 may be integral (built-in) to the slider structure.

The anode 708 of the laser diode 706 is coupled to the first electrical bond pad 712a. The cathode 710 of the laser diode 706 is coupled to the second electrical bond pad 712b. The first and second electrical bond pads 712a, 712b, supply a differential voltage, $V_a$-$V_b$, across the laser diode 706 which, together with the current fed to the laser diode 706, controls the optical output of the laser diode 706.

In the embodiment shown in FIG. 7, the heater 722 is coupled between the cathode 710 of the laser diode 706 and the ground pad 712c. The heater 722 is a resistive element, such as a resistor or a thermistor. The difference between the common-mode voltage $V_b$ and the potential at the ground pad 712c causes current to flow through the heater 722, heat from which warms a junction of the laser diode 706. Because the difference between the common-mode voltage $V_b$ at the cathode 710 and the ground pad potential is independent of the differential voltage, $V_a$-$V_b$, the magnitude of the voltage across and current flow through the heater 722 is independent of the voltage across and current flow through the laser diode 706. The spatial proximity of the heater 722 to the junction of the laser diode 706 is such that heat can quickly diffuse to the laser diode junction.

As in the case of the embodiment illustrated in FIG. 6, the heater 722 shown in FIG. 7 can be activated to pre-heat the laser diode 706 prior to a write operation in order to avoid one or more critical temperatures associated with laser output power instability. The intensity of the heat generated by the heater 722 during pre-heating can be controlled by adjusting the magnitude of the difference between the common-mode voltage $V_b$ and the ground pad 712c. The heater 722 can also be activated to generate steering heat for heating the laser diode 706 during the write operation in order to avoid one or more critical temperatures associated with laser output power instability. The intensity of the steering heat generated by the heater 722 can be controlled by adjusting the magnitude of the difference between the common-mode voltage $V_b$ and the ground pad 712c.

According to various embodiments, a laser diode driver 702 is coupled to the first and second electrical bond pads 712a, 712b. The laser diode driver 702 can be configured to set and adjust the magnitude and polarity of a voltage provided at each of the first and second electrical bond pads 712a, 712b. The laser diode driver 702 or another component coupled to the slider (e.g., a preamplifier) can be configured to set and adjust the magnitude and polarity of the potential at the ground pad 712c. It is noted that the laser diode driver 702 is configured to supply the laser diode 706 with specified currents (e.g., $I_{BIAS}$, $I_{OP}$) during various operations (e.g., seeks, write operations) in addition to the current supplied to the heater 722.

The magnitude and adjustment of the differential voltage, $V_a$-$V_b$, and the current fed to the laser diode 706 (via the first and second electrical bond pads 712a, 712b) is controlled by the laser diode driver 702. The laser diode driver 702 also controls the magnitude and adjustment of the common-mode voltage $V_b$ between the cathode 710 and the ground pad 712c. For example, the laser diode driver 702 can increase or decrease the magnitude (and/or change the polarity) of the common-mode voltage $V_b$ to set and/or adjust the heat generated by the heater 722 (e.g., for generating pre-heat and steering heat), while keeping the differential voltage, $V_a$-$V_b$, at a constant magnitude.

Figure 8:
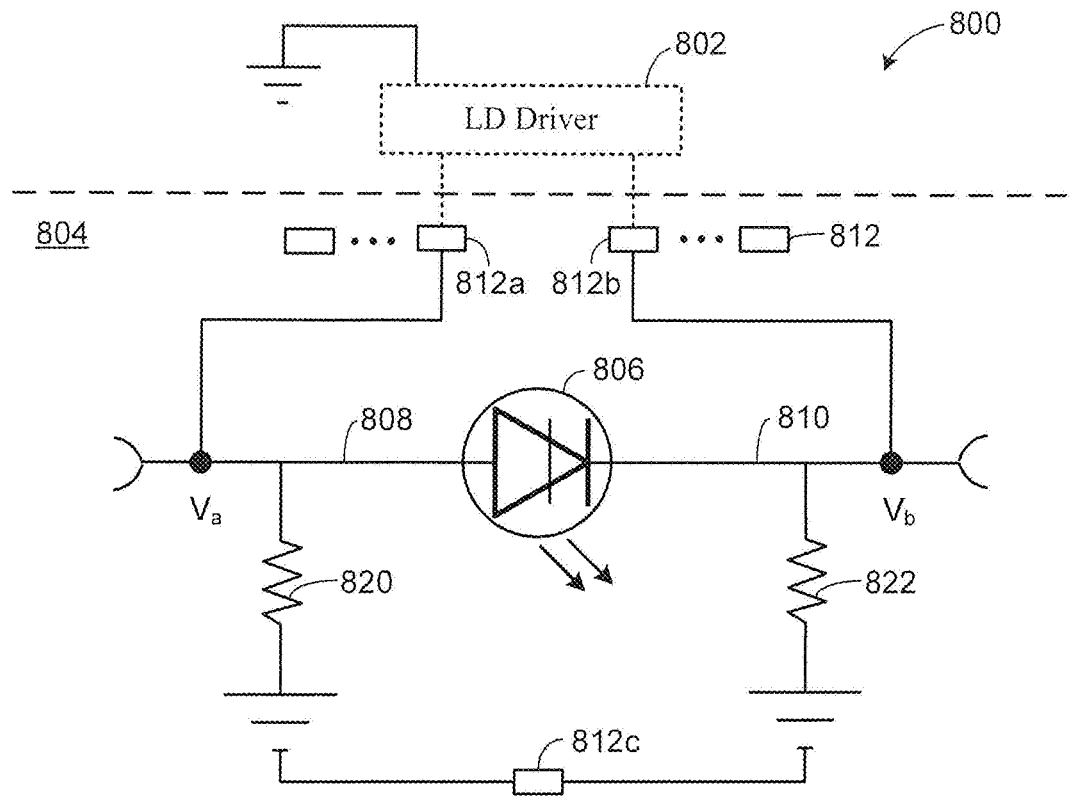
FIG. 8 illustrates circuitry of a HAMR slider including a heater proximate a laser diode in accordance with various embodiments.

FIG. 8 illustrates circuitry of a HAMR slider including a heater proximate a laser diode in accordance with various embodiments. The circuitry 800 is configured to operate in a manner similar to that shown in FIGS. 6 and 7. The circuitry 800 shown in FIG. 8 includes a slider 804 configured for HAMR. The slider 804 includes a multiplicity of bond pads 812 including a first electrical bond pad 812a, a second electrical bond pad 812b, and a ground pad 812c. A laser diode 806 includes an anode 808 and a cathode 810. In some embodiments, the laser diode 806 can be incorporated in an LDU mounted to an external surface of the slider 804 (e.g., via a submount) and optically coupled to integrated optics of the slider 804. The LDU may include one or more heaters 820, 822. In other embodiments, the laser diode 806 may be integral (built-in) to the slider structure.

The anode 808 of the laser diode 806 is coupled to the first electrical bond pad 812a. The cathode 810 of the laser diode 806 is coupled to the second electrical bond pad 812b. The first and second electrical bond pads 812a, 812b, supply a differential voltage, $V_a$-$V_b$, across the laser diode 806 which, together with the current fed to the laser diode 806, controls the optical output of the laser diode 806.

In the embodiment shown in FIG. 8, a first heater 820 is coupled between the anode 808 of the laser diode 806 and the ground pad 812c. A second heater 822 is coupled between the cathode 810 of the laser diode 806 and the ground pad 812c. The first and second heaters 820, 822 are resistive elements, such as resistors or thermistors. In some embodiments, one of the first and second heaters 820, 822 can be a resistor, while the other of the first and second heaters 820, 822 can be a thermistor. Provision of the first and second heaters 820, 822 respectively between the laser diode 806 and the ground pad 812c provides for a balanced resistive heater design, with enhanced ground noise suppression.

The difference between the common-mode voltage $V_a$ and the potential at the ground pad 812c causes current to flow through the first heater 820, heat from which warms a junction of the laser diode 806. The difference between the common-mode voltage $V_b$ and the potential at the ground pad 812c causes current to flow through the second heater 822, heat from which warms the junction of the laser diode 806. Because differences between the ground pad potential and the common-mode voltages $V_a$, $V_b$ at the anode and cathode 808, 810 are independent of the differential voltage, $V_a$-$V_b$, the magnitudes of currents flowing through the first and second heaters 820, 822 are independent of the current flow through the laser diode 806. The spatial proximity of the first and second heaters 820, 822 to the junction of the laser diode 806 is such that heat can quickly diffuse to the laser diode junction.

As in the case of the embodiments illustrated in FIGS. 6 and 7, the first and second heaters 820, 822 shown in FIG. 8 can be activated to pre-heat the laser diode 806 prior to a write operation in order to avoid one or more critical temperatures associated with laser output power instability. The intensity of the heat generated by the first and second heaters 820, 822 during pre-heating can be controlled by adjusting the magnitudes of the difference between the common-mode voltages $V_a$, $V_b$ relative to the potential of the ground pad 812c. The first and second heaters 820, 822 can also be activated to generate steering heat for heating the laser diode 806 during the write operation in order to avoid one or more critical temperatures associated with laser output power instability. The intensity of the steering heat generated by the first and second heaters 820, 822 can be controlled by adjusting the magnitudes of the difference between the common-mode voltages $V_a$, $V_b$ and the potential of the ground pad 812c.

According to various embodiments, a laser diode driver 802 is coupled to the first and second electrical bond pads 812a, 812b. The laser diode driver 802 can be configured to set and adjust the magnitude and polarity of a voltage provided at each of the first and second electrical bond pads 812a, 812b. The laser diode driver 802 or another component coupled to the slider (e.g., a preamplifier) can be configured to set and adjust the magnitude and polarity of the potential at the ground pad 812c. It is noted that the laser diode driver 802 is configured to supply the laser diode 806 with specified currents (e.g., $I_{BIAS}$, $I_{OP}$) during various operations (e.g., seeks, write operations) in addition to the current supplied to the first and second heaters 820, 822.

The magnitude and adjustment of the differential voltage, $V_a$-$V_b$, and the current fed to the laser diode 806 (via the first and second electrical bond pads 812a, 812b) is controlled by the laser diode driver 802. The laser diode driver 802 also controls the magnitudes and adjustment of the common-mode voltages $V_a$, $V_b$ between the ground pad 812c and the anode and cathode 808, 810, respectively. For example, the laser diode driver 802 can increase or decrease the magnitude (and/or change the polarity) of one or both of the common-mode voltages $V_a$, $V_b$ to set and/or adjust the heat generated by the first and second heaters 820, 822 (e.g., for generating pre-heat and steering heat), while keeping the differential voltage, $V_a$-$V_b$, at a constant magnitude.

Figure 9:
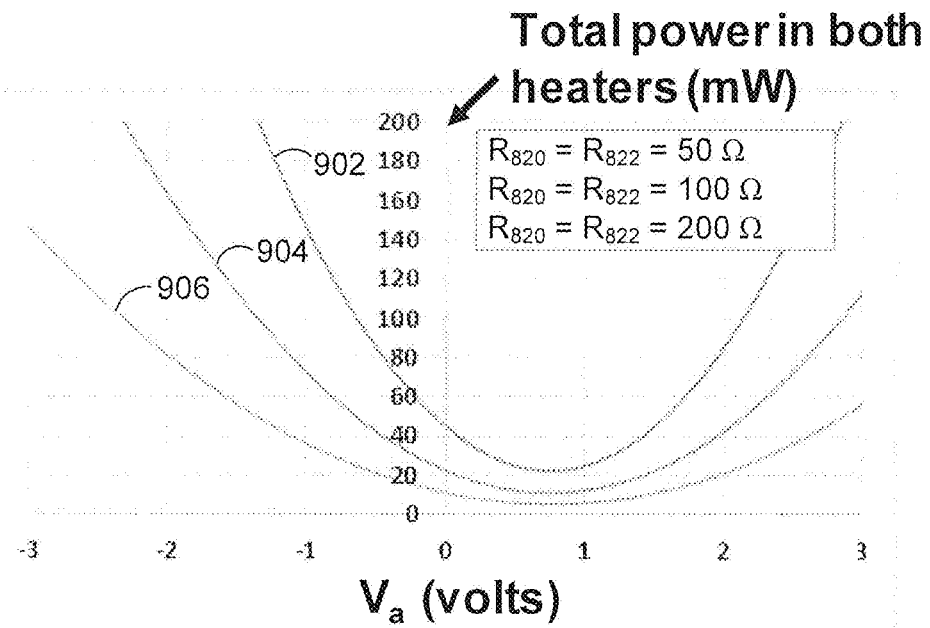
FIG. 9 illustrates circuitry of a HAMR slider including a heater proximate a laser diode in accordance with various embodiments.

FIG. 9 is a graph showing total power dissipated by the first and second heaters 820, 822 for different values of resistance and a differential voltage, $V_a$-$V_b$, of 1.5 V. In FIG. 9, the resistances of the first and second heaters 820, 822 are the same. Curves 902, 904, and 906 show the change in total power dissipated by the first and second heaters 820, 822 in response to changes in common-mode voltage, $V_a$, at the anode 808 of the laser diode 806, while keeping the differential voltage, $V_a$-$V_b$, constant at 1.5 V. Curve 902 shows the change in total power dissipated by the first and second heaters 820, 822 where the first and second heaters 820, 822 each have a resistance of 50Ω. Curve 904 shows the change in total power dissipated by the first and second heaters 820, 822 where the first and second heaters 820, 822 each have a resistance of 100Ω. Curve 906 shows the change in total power dissipated by the first and second heaters 820, 822 where the first and second heaters 820, 822 each have a resistance of 200Ω.

Figure 10:
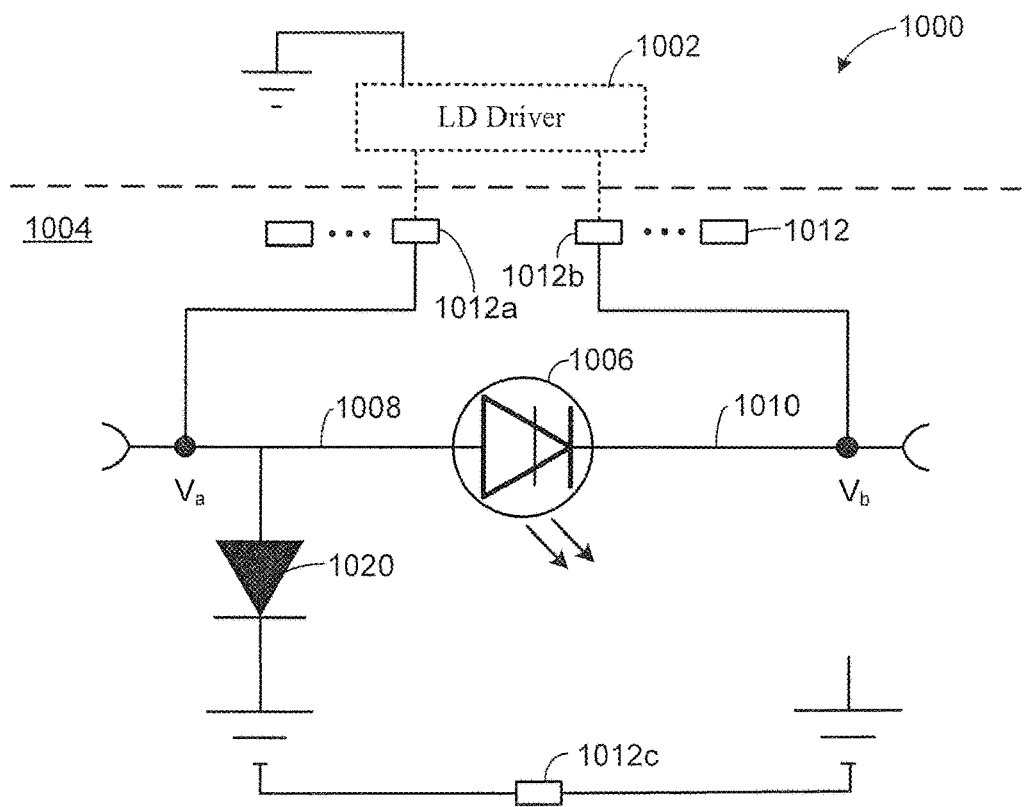
FIG. 10 illustrates circuitry of a HAMR slider including a heater proximate a laser diode in accordance with various embodiments.

FIG. 10 illustrates circuitry of a HAMR slider including a heater situated proximate a laser diode in accordance with various embodiments. The circuitry 1000 shown in FIG. 10 includes a slider 1004 configured for HAMR. The slider 1004 includes a multiplicity of bond pads 1012 including a first electrical bond pad 1012a, a second electrical bond pad 1012b, and a ground pad 1012c. A laser diode 1006 includes an anode 1008 and a cathode 1010. In some embodiments, the laser diode 1006 can be incorporated in an LDU mounted to an external surface of the slider 1004 (e.g., via a submount) and optically coupled to integrated optics of the slider 1004. The LDU can incorporate a heater 1020. In other embodiments, the laser diode 1006 may be integral (built-in) to the slider structure.

The anode 1008 of the laser diode 1006 is coupled to the first electrical bond pad 1012a. The cathode 1010 of the laser diode 1006 is coupled to the second electrical bond pad 1012b. The first and second electrical bond pads 1012a, 1012b, supply a differential voltage, $V_a$-$V_b$, across the laser diode 1006 which, together with the current fed to the laser diode 1006, controls the optical output of the laser diode 1006.

In the embodiment shown in FIG. 10, the heater 1020 is coupled between the anode 1008 of the laser diode 1006 and the ground pad 1012c. The heater 1020 is or includes a diode. The diode may comprise silicon, gallium arsenide or germanium. The P-N junction of the diode 1020 generates heat when the diode 1020 is forward biased and conducting current. Given the diode polarity shown in FIG. 10, the diode 1020 conducts current and generates heat when the difference between the common-mode voltage $V_a$ and the potential at the ground pad 1012c is a positive voltage that exceeds the threshold voltage of the diode 1020. The diode 1020 ceases to conduct current and generate heat when the difference between the common-mode voltage $V_a$ and the potential at the ground pad 1012c is a negative voltage (reverse biased) or a positive voltage below the threshold voltage of the diode 1020.

When forward biased, current flowing through the P-N junction of the diode 1020 warms the junction of the laser diode 1006. The intensity of the heat generated by the diode 1020 can be adjusted by appropriately adjusting the potential difference between the common-mode voltage $V_a$ and the potential at the ground pad 1012c. For example, the diode 1020 can be transitioned between conducting and non-conducting states (e.g., of the same or different duration) to achieve a desired heat output by the diode 1020. Because the difference between the common-mode voltage $V_a$ at the anode 1008 and the ground pad potential is independent of the differential voltage, $V_a$-$V_b$, the voltage across and current flow through the diode 1020 is independent of the voltage across and current flow through the laser diode 1006. The spatial proximity of the diode 1020 to the junction of the laser diode 1006 is such that heat can quickly diffuse to the laser diode junction.

As in the case of the embodiment illustrated in FIGS. 6-9, the diode 1020 shown in FIG. 10 can be activated to pre-heat the laser diode 1006 prior to a write operation in order to avoid one or more critical temperatures associated with laser output power instability. The diode 1020 can also be activated to generate steering heat for heating the laser diode 1006 during the write operation in order to avoid one or more critical temperatures associated with laser output power instability.

According to various embodiments, a laser diode driver 1002 is coupled to the first and second electrical bond pads 1012a, 1012b. The laser diode driver 1002 can be configured to set and adjust the magnitude and polarity of a voltage provided at each of the first and second electrical bond pads 1012a, 1012b. The laser diode driver 1002 or another component coupled to the slider (e.g., a preamplifier) can be configured to set and adjust the magnitude and polarity of the potential at the ground pad 1012c. It is noted that the laser diode driver 1002 is configured to supply the laser diode 1006 with specified currents (e.g., $I_{BIAS}$, $I_{OP}$) during various operations (e.g., seeks, write operations) in addition to the current supplied to the diode 1020.

The magnitude and adjustment of the differential voltage, $V_a$-$V_b$, and the current fed to the laser diode 1006 (via the first and second electrical bond pads 1012a, 1012b) is controlled by the laser diode driver 1002. The laser diode driver 1002 also controls the magnitude and adjustment of the common-mode voltage $V_a$ between the anode 1008 and the ground pad 1012c. For example, the laser diode driver 1002 can increase or decrease the magnitude (and/or change the polarity) of the common-mode voltage $V_a$ relative to the ground pad potential to set and/or adjust the heat generated by the diode 1020 (e.g., for generating pre-heat and steering heat), while keeping the differential voltage, $V_a$-$V_b$, at a constant magnitude.

Figure 11:
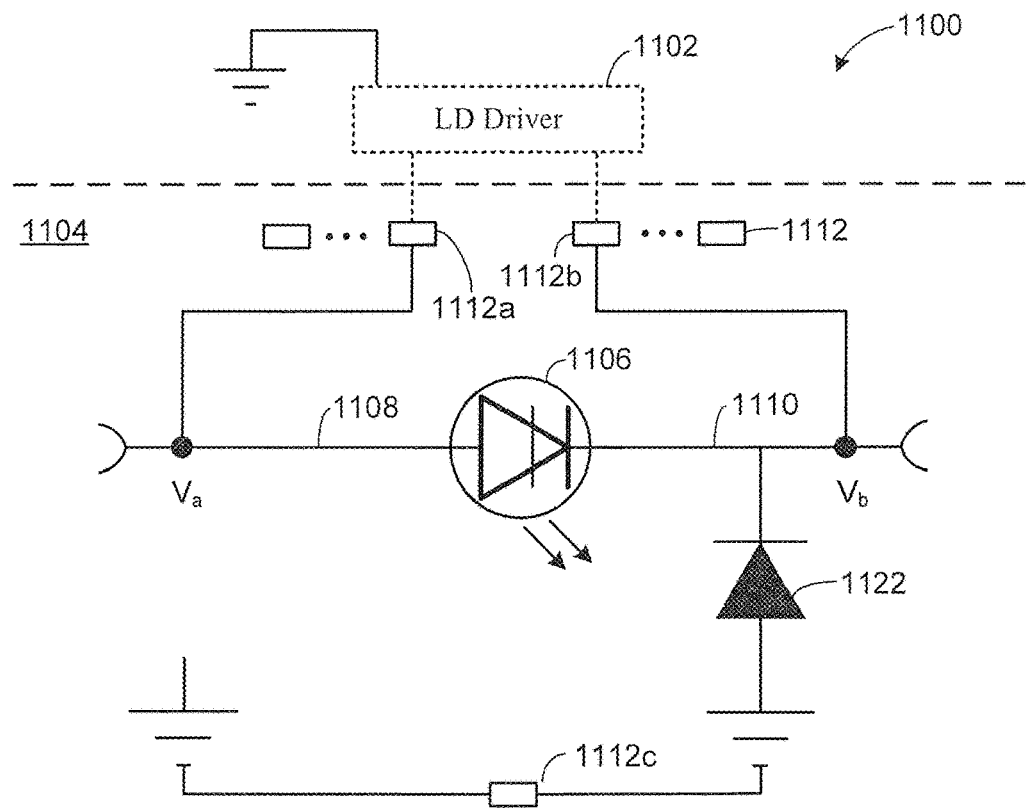
FIG. 11 illustrates circuitry of a HAMR slider including a heater proximate a laser diode in accordance with various embodiments.

FIG. 11 illustrates circuitry of a HAMR slider including a heater situated proximate a laser diode in accordance with various embodiments. The circuitry 1100 shown in FIG. 11 includes a slider 1104 configured for HAMR. The slider 1104 includes a multiplicity of bond pads 1112 including a first electrical bond pad 1112a, a second electrical bond pad 1112b, and a ground pad 1112c. A laser diode 1106 includes an anode 1108 and a cathode 1110. In some embodiments, the laser diode 1106 can be incorporated in an LDU mounted to an external surface of the slider 1104 (e.g., via a submount) and optically coupled to integrated optics of the slider 1104. The LDU can also incorporate a heater 1122. In other embodiments, the laser diode 1106 may be integral (built-in) to the slider structure.

The anode 1108 of the laser diode 1106 is coupled to the first electrical bond pad 1112a. The cathode 1110 of the laser diode 1106 is coupled to the second electrical bond pad 1112b. The first and second electrical bond pads 1112a, 1112b, supply a differential voltage, $V_a$-$V_b$, across the laser diode 1106 which, together with the current fed to the laser diode 1106, controls the optical output of the laser diode 1106.

In the embodiment shown in FIG. 11, the heater 1122 is coupled between the cathode 1110 of the laser diode 1106 and the ground pad 1112c. The heater 1122 is or includes a diode. The diode may comprise silicon, gallium arsenide or germanium. The P-N junction of the diode 1122 generates heat when the diode 1122 is forward biased and conducting current. Given the diode polarity shown in FIG. 11, the diode 1122 conducts current and generates heat when the difference between the potential at the ground pad 1112c and the common-mode voltage $V_b$ is a positive voltage that exceeds the threshold voltage of the diode 1122. The diode 1122 ceases to conduct current and generate heat when the difference between the potential at the ground pad 1112c and the common-mode voltage $V_b$ is a negative voltage (reverse biased) or a positive voltage below the threshold voltage of the diode 1122.

When forward biased, current flowing through the P-N junction of the diode 1122 warms the junction of the laser diode 1106. The intensity of the heat generated by the diode 1122 can be adjusted by appropriately adjusting the potential difference between the potential at the ground pad 1112c and the common-mode voltage $V_b$. For example, the diode 1122 can be transitioned between conducting and non-conducting states (e.g., of the same or different duration) to achieve a desired heat output by the diode 1122. Because the difference between the ground pad potential and the common-mode voltage $V_b$ at the cathode 1110 is independent of the differential voltage, $V_a$-$V_b$, the voltage across and current flow through the diode 1122 is independent of the voltage across and current flow through the laser diode 1106. The spatial proximity of the diode 1122 to the junction of the laser diode 1106 is such that heat can quickly diffuse to the laser diode junction.

As in the case of the embodiment illustrated in FIGS. 6-10, the diode 1122 shown in FIG. 11 can be activated to pre-heat the laser diode 1106 prior to a write operation in order to avoid one or more critical temperatures associated with laser output power instability. The diode 1122 can also be activated to generate steering heat for heating the laser diode 1106 during the write operation in order to avoid one or more critical temperatures associated with laser output power instability.

According to various embodiments, a laser diode driver 1102 is coupled to the first and second electrical bond pads 1112a, 1112b. The laser diode driver 1102 can be configured to set and adjust the magnitude and polarity of a voltage provided at each of the first and second electrical bond pads 1112a, 1112b. The laser diode driver 1102 or another component coupled to the slider (e.g., a preamplifier) can be configured to set and adjust the magnitude and polarity of the potential at the ground pad 1112c. It is noted that the laser diode driver 1102 is configured to supply the laser diode 1106 with specified currents (e.g., $i_{ffAs}$, $I_{on}$) during various operations (e.g., seeks, write operations) in addition to the current supplied to the diode 1122.

The magnitude and adjustment of the differential voltage, $V_a$-$V_b$, and the current fed to the laser diode 1106 (via the first and second electrical bond pads 1112a, 1112b) is controlled by the laser diode driver 1102. The laser diode driver 1102 also controls the magnitude and adjustment of the common-mode voltage $V_b$ between the cathode 1110 and the ground pad 1112c. For example, the laser diode driver 1102 can increase or decrease the magnitude (and/or change the polarity) of the common-mode voltage $V_b$ relative to the ground pad potential to set and/or adjust the heat generated by the diode 1122 (e.g., for generating pre-heat and steering heat), while keeping the differential voltage, $V_a$-$V_b$, at a constant magnitude.

Figure 12:
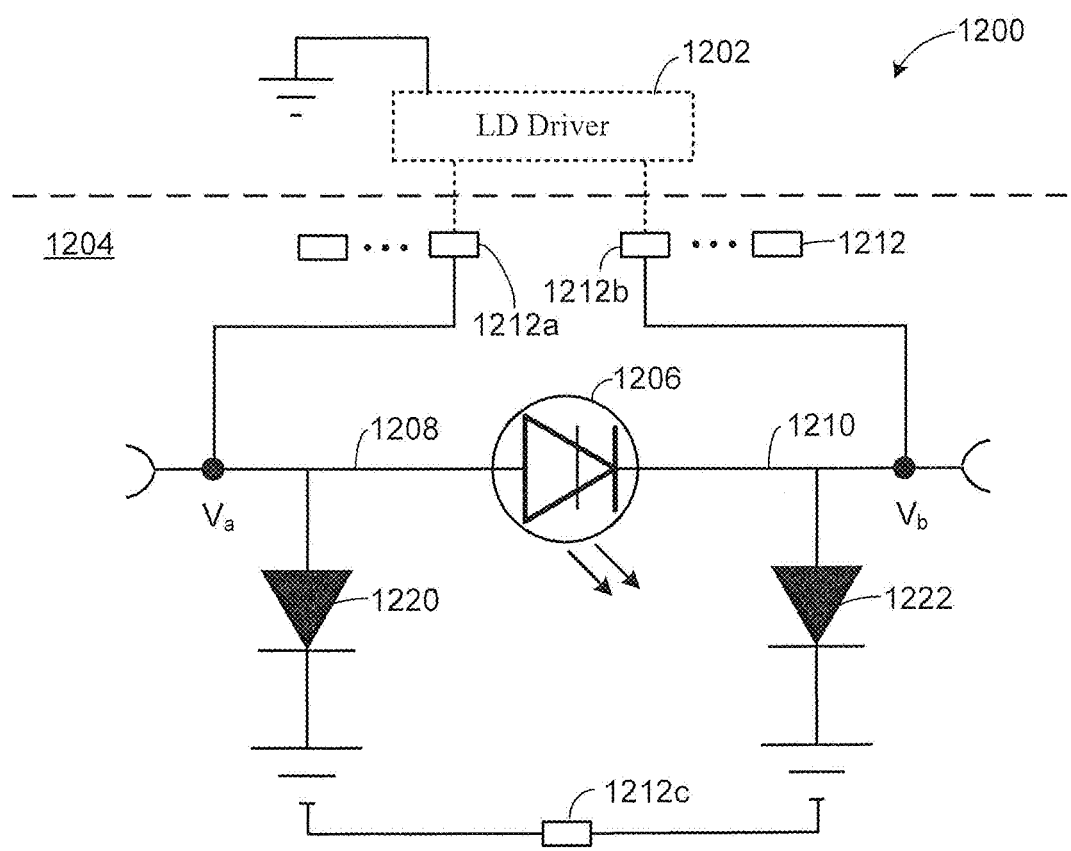
FIG. 12 illustrates circuitry of a HAMR slider including a heater proximate a laser diode in accordance with various embodiments.

FIG. 12 illustrates circuitry of a HAMR slider including a heater situated proximate a laser diode in accordance with various embodiments. The circuitry 1200 shown in FIG. 12 includes a slider 1204 configured for HAMR. The slider 1204 includes a multiplicity of bond pads 1212 including a first electrical bond pad 1212a, a second electrical bond pad 1212b, and a ground pad 1212c. A laser diode 1206 includes an anode 1208 and a cathode 1210. In some embodiments, the laser diode 1206 can be incorporated in an LDU mounted to an external surface of the slider 1204 (e.g., via a submount) and optically coupled to integrated optics of the slider 1204. The LDU can incorporate a multiplicity of heaters 1220, 1222. In other embodiments, the laser diode 1206 may be integral (built-in) to the slider structure.

The anode 1208 of the laser diode 1206 is coupled to the first electrical bond pad 1212a. The cathode 1210 of the laser diode 1206 is coupled to the second electrical bond pad 1212b. The first and second electrical bond pads 1212a, 1212b, supply a differential voltage, $V_a$-$V_b$, across the laser diode 1206 which, together with the current fed to the laser diode 1206, controls the optical output of the laser diode 1206.

In the embodiment shown in FIG. 12, a first heater 1220 is coupled between the anode 1208 of the laser diode 1206 and the ground pad 1212c. A second heater 1222 is coupled between the cathode 1210 of the laser diode 1206 and the ground pad 1212c. Each of the heaters 1220, 1222 is or includes a diode. The diodes 1220, 1222 may comprise silicon, gallium arsenide or germanium. In the embodiment shown in FIG. 12, the threshold voltage of diode 1220 is preferably substantially larger than the threshold voltage of diode 1222. Diodes with these characteristics are commercially available.

The P-N junctions of the diodes 1220, 1222 generate heat when the diodes 1220, 1222 are forward biased and conducting current. Given the diode polarities shown in FIG. 12, the first diode 1220 conducts current and generates heat when the difference between the common-mode voltage $V_a$ and the potential at the ground pad 1212c is a positive voltage that exceeds the threshold voltage of the diode 1220. The diode 1220 ceases to conduct current and generate heat when the difference between the common-mode voltage $V_a$ and the potential at the ground pad 1212c is a negative voltage (reverse biased) or a positive voltage below the threshold voltage of the diode 1220. The second diode 1222 conducts current and generates heat when the difference between the common-mode voltage $V_b$ and the potential at the ground pad 1212c is a positive voltage that exceeds the threshold voltage of the diode 1222. The diode 1222 ceases to conduct current and generate heat when the difference between the common-mode voltage $V_b$ and the potential at the ground pad 1212c is a negative voltage (reverse biased) or a positive voltage below the threshold voltage of the diode 1220.

When forward biased, currents flowing through the P-N junctions of the diodes 1220, 1222 warm the junction of the laser diode 1206. The intensity of the heat generated by the diodes 1220, 1222 can be adjusted by appropriately adjusting the potential difference between the potential at the ground pad 1212c and the common-mode voltages $V_a$, $V_b$. For example, the diodes 1220, 1222 can be transitioned between conducting and non-conducting states (e.g., of the same or different duration) to achieve a desired heat output by the diodes 1220, 1222. Because the differences between the ground pad potential and the common-mode voltages $V_a$, $V_b$ respectively at the anode 1208 and cathode 1210 are independent of the differential voltage, $V_a$-$V_b$, the voltage across and current flow through the diodes 1220, 1222 is independent of the voltage across and current flow through the laser diode 1206. The spatial proximity of the diodes 1220, 1222 to the junction of the laser diode 1206 is such that heat can quickly diffuse to the laser diode junction.

As in the case of the embodiment illustrated in FIGS. 6-11, the diodes 1220, 1222 shown in FIG. 12 can be activated to pre-heat the laser diode 1206 prior to a write operation in order to avoid one or more critical temperatures associated with laser output power instability. The diodes 1220, 1222 can also be activated to generate steering heat for heating the laser diode 1206 during the write operation in order to avoid one or more critical temperatures associated with laser output power instability.

According to various embodiments, a laser diode driver 1202 is coupled to the first and second electrical bond pads 1212a, 1212b. The laser diode driver 1202 can be configured to set and adjust the magnitude and polarity of a voltage provided at each of the first and second electrical bond pads 1212a, 1212b. The laser diode driver 1202 or another component coupled to the slider (e.g., a preamplifier) can be configured to set and adjust the magnitude and polarity of the potential at the ground pad 1212c. It is noted that the laser diode driver 1202 is configured to supply the laser diode 1206 with specified currents (e.g., $I_{BIAS}$, $I_{OP}$) during various operations (e.g., seeks, write operations) in addition to the currents supplied to the diodes 1220, 1222.

The magnitude and adjustment of the differential voltage, $V_a$-$V_b$, and the current fed to the laser diode 1206 (via the first and second electrical bond pads 1212a, 1212b) is controlled by the laser diode driver 1202. The laser diode driver 1202 also controls the magnitude and polarity of the common-mode voltages $V_a$, $V_b$ and the potential at the ground pad 1212c. For example, the laser diode driver 1202 can increase or decrease the magnitude (and/or change the polarity) of the common-mode voltages $V_a$, $V_b$ relative to the ground pad potential to set and/or adjust the heat generated by the diodes 1220, 1222 (e.g., for generating pre-heat and steering heat), while keeping the differential voltage, $V_a$-$V_b$, at a constant magnitude.

Figure 13:
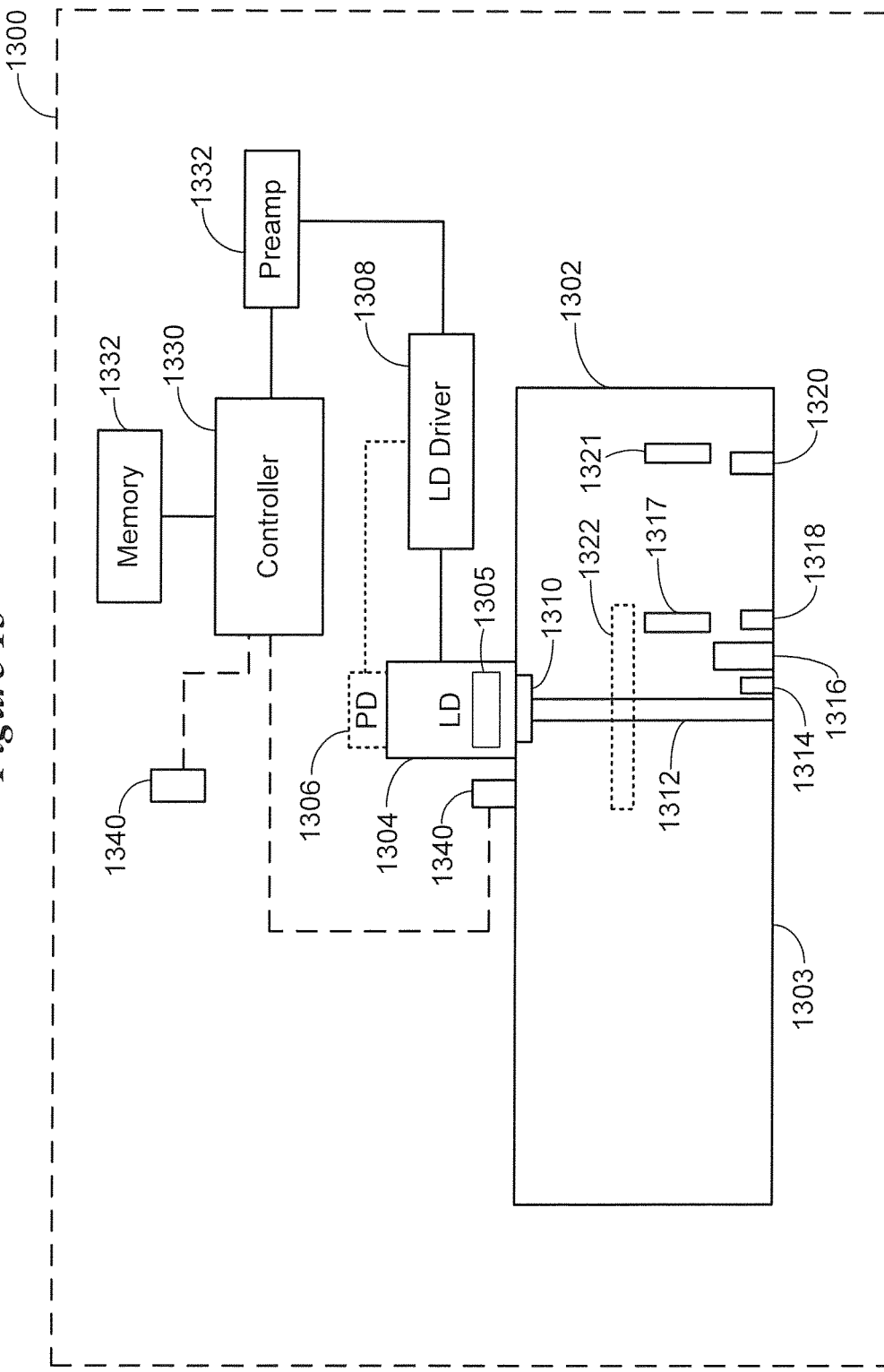
FIG. 13 is a block diagram of a system for heating a laser diode of a HAMR head in accordance with various embodiments.

FIG. 13 is a block diagram of a system for heating a laser diode of a HAMR head in accordance with various embodiments. FIG. 13 shows a portion of a HAMR drive 1300 which includes a slider 1302 upon which a laser diode 1304 is mounted. A heater 1305 is thermally coupled to the laser diode 1304. A photodetector 1306 can be mounted on or in close proximity to the laser diode 1304. A laser diode driver 1308 is coupled to the laser diode 1304 and provides a differential voltage across, and a supply current (e.g., $I_{BIAS}$, $I_{OP}$) to, the laser diode 1304. It is noted that $I_{BIAS}$ refers to a current greater than a threshold current of the laser diode 1304 but less than the current specified for a write operation, referred to as $I_{OP}$. An output of the photodetector 1306 is coupled to the laser diode driver 1308. The laser diode driver 1308 can adjust the differential voltage and current supplied to the laser diode 1304 in response to the photodetector output. In some embodiments, a bolometer 1322 is situated proximate an optical waveguide 1312 of the slider 1302 and used as a laser power monitor instead of the photodetector 1306.

The slider 1302 includes a number of components including the optical waveguide 1312 which is optically coupled to the laser diode 1304 via an optical coupler 1310. The optical waveguide 1312 extends from the optical coupler 1310 to an NFT 1314 situated at the air bearing surface 1303 proximate the optical waveguide 1312. A writer 1316 is situated proximate the NFT 1314. A writer heater 1317 is situated proximate the writer 1316 and configured to thermally actuate the writer 1316 (e.g., writer pole/NFT). A contact sensor 1318 may be situated proximate the writer 1316 and NFT 1314 (e.g., at a close point of the writer). A reader 1320 is shown positioned away from the writer 1316 and contact sensor 1318. A reader heater 1321 is positioned proximate the reader 1320 and configured to thermally actuate the reader 1320. A temperature sensor 1340 (e.g., a thermistor or thermocouple) may be provided in the HAMR drive 1300 to measure an operating temperature of the drive 1300. In some embodiments, the temperature sensor 1340 is positioned close to the laser diode 1304 or the slider 1302. In other embodiments, the temperature sensor 1340 is positioned away from the slider 1302 but within the enclosure of the drive 1300.

The HAMR drive 1300 further includes a controller 1330 (e.g., microprocessor or microcontroller) coupled to non-volatile memory 1332 and a preamplifier 1332. The preamplifier 1332, alone or in cooperation with the controller 1330, is configured to implement executable instructions corresponding to the flow charts and other figures discussed hereinabove. As was discussed previously, the laser diode driver 1308 can be incorporated in the preamplifier 1332.

Systems, devices or methods disclosed herein may include one or more of the features structures, methods, or combination thereof described herein. For example, a device or method may be implemented to include one or more of the features and/or processes above. It is intended that such device or method need not include all of the features and/or processes described herein, but may be implemented to include selected features and/or processes that provide useful structures and/or functionality. Various modifications and additions can be made to the disclosed embodiments discussed above. Accordingly, the scope of the present disclosure should not be limited by the particular embodiments described above, but should be defined only by the claims set forth below and equivalents thereof

What is claimed is:

1. An apparatus, comprising:
   a slider configured to facilitate heat assisted magnetic recording, the slider comprising a plurality of bond pads including a first electrical bond pad, a second electrical bond pad, and a ground pad;
   a laser diode comprising an anode coupled to the first electrical bond pad and a cathode coupled to the second electrical bond pad, the laser diode operable in a non-lasing state and a lasing state; and
   a heater coupled between the ground pad and at least one of the anode and cathode of the laser diode, the heater configured to generate heat for heating the laser diode during the non-lasing state and the lasing state.

2. The apparatus of claim 1, wherein the heater is configured to heat the laser diode to avoid a temperature associated with power instability of the laser diode when in the lasing state during a write operation.

3. The apparatus of claim 1, wherein the heater is configured to:
   generate heat for pre-heating the laser diode during the non-lasing state; and
   generate steering heat for heating the laser diode when in the lasing state during a write operation.

4. The apparatus of claim 1, wherein the heater comprises a resistive element.

5. The apparatus of claim 1, wherein the heater comprises a diode.

6. The apparatus of claim 1, wherein the heater comprises:
   a first resistive element coupled between the ground pad and the anode of the laser diode; and
   a second resistive element coupled between the ground pad and the cathode of the laser diode.

7. The apparatus of claim 1, wherein the heater comprises:
   a first diode coupled between the ground pad and the anode of the laser diode; and
   a second diode coupled between the ground pad and the cathode of the laser diode.

8. An apparatus, comprising:
   a slider configured to facilitate heat assisted magnetic recording, the slider comprising a plurality of bond pads including a first electrical bond pad, a second electrical bond pad, and a ground pad;
   a laser diode comprising an anode coupled to the first electrical bond pad and a cathode coupled to the second electrical bond pad, the laser diode operable in a lasing state in response to a first differential voltage supplied to the anode and the cathode, and the laser diode operable in a non-lasing state in response to a second differential voltage supplied to the anode and the cathode; and
   a heater coupled between the ground pad and at least one of the anode and cathode of the laser diode, the heater configured to generate heat for heating the laser diode during the non-lasing state and the lasing state in response to a common-mode voltage developed between the ground pad and the at least one of the anode and cathode of the laser diode.

9. The apparatus of claim 8, wherein the heater is configured to heat the laser diode to avoid a temperature associated with power instability of the laser diode when in the lasing state during a write operation.

10. The apparatus of claim 8, wherein the heater is configured to:
    generate heat for pre-heating the laser diode during the non-lasing state; and
    generate steering heat for heating the laser diode when in the lasing state during a write operation.

11. The apparatus of claim 8, wherein a magnitude of the common-mode voltage is independent of a magnitude of the differential voltage.

12. The apparatus of claim 8, comprising a laser diode driver coupled to the first and second electrical bond pads, wherein the laser diode driver is configured to adjust a magnitude of the common-mode voltage while maintaining the differential voltage at a substantially constant magnitude.

13. The apparatus of claim 8, wherein the heater comprises a resistive element.

14. The apparatus of claim 8, wherein the heater comprises a diode.

15. The apparatus of claim 8, wherein the heater comprises:
    a first resistive element coupled between the ground pad and the anode of the laser diode; and
    a second resistive element coupled between the ground pad and the cathode of the laser diode.

16. The apparatus of claim 8, wherein the heater comprises:
    a first diode coupled between the ground pad and the anode of the laser diode; and
    a second diode coupled between the ground pad and the cathode of the laser diode.

* * * * *